US012565415B2

(12) United States Patent
Anzinger et al.

(10) Patent No.: US 12,565,415 B2
(45) Date of Patent: Mar. 3, 2026

(54) MEMS SOUND TRANSDUCER ELEMENT

(71) Applicant: Infineon Technologies AG, Neubiberg (DE)

(72) Inventors: Sebastian Anzinger, Holzkirchen (DE); Christian Bretthauer, Munich (DE); Marc Fueldner, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 1277 days.

(21) Appl. No.: 16/895,366

(22) Filed: Jun. 8, 2020

(65) Prior Publication Data

US 2021/0017016 A1     Jan. 21, 2021

(30) Foreign Application Priority Data

Jul. 15, 2019    (EP) .................................... 19186308

(51) Int. Cl.
B81B 3/00 (2006.01)
B81C 1/00 (2006.01)
(Continued)

(52) U.S. Cl.
CPC ........ B81B 3/0021 (2013.01); B81C 1/00166 (2013.01); H04R 19/04 (2013.01);
(Continued)

(58) Field of Classification Search
CPC .......... B81B 3/0021; B81B 2201/0257; B81C 1/00166; H01L 41/047; H04R 19/04;
(Continued)

(56) References Cited

U.S. PATENT DOCUMENTS

2011/0003614 A1    1/2011  Langereis et al.
2014/0061826 A1*   3/2014  Hong .................... B06B 1/0292
257/416

(Continued)

FOREIGN PATENT DOCUMENTS

CN          106999984  A      8/2017
CN          108540911  A      9/2018
DE       102013217300 A1      5/2014

*Primary Examiner* — Steven B Gauthier
*Assistant Examiner* — Sun Mi Kim King
(74) *Attorney, Agent, or Firm* — Slater Matsil, LLP

(57) ABSTRACT

A MEMS sound transducer element is operable in an audio and an ultrasonic range. The MEMS sound transducer element includes a first electrode structure, wherein a conductive material of the first electrode structure includes a plurality of electrically isolated electrode segments, and a second electrode structure spaced apart from the first electrode structure, wherein the first electrode structure and the second electrode structure are operable as an audio sound transducer. A first subset of the plurality of electrically isolated electrode segments of the first electrode structure is, in conjunction with the second electrode structure, operable as an ultrasonic or audio emitter, and a second subset of the plurality of the electrically isolated electrode segments of the first electrode structure is, in conjunction with the second electrode structure, operable as an ultrasonic or audio receiver.

14 Claims, 9 Drawing Sheets

(51) Int. Cl.
  H04R 19/04   (2006.01)
  H10N 30/87   (2023.01)

(52) U.S. Cl.
  CPC .......... H10N 30/87 (2023.02); B06B 2201/55
    (2013.01); B81B 2201/0257 (2013.01); H04R
             2201/003 (2013.01)

(58) Field of Classification Search
  CPC .............. H04R 2201/003; H04R 23/00; H04R
      17/005; H04R 19/016; B06B 2201/55;
         B06B 2201/20; B06B 1/0292
  See application file for complete search history.

(56)        References Cited

U.S. PATENT DOCUMENTS

| | | | |
|---|---|---|---|
| 2015/0156591 A1 | 6/2015 | Schelling et al. | |
| 2016/0340173 A1* | 11/2016 | Klein ................... | H04R 19/005 |
| 2017/0260040 A1 | 9/2017 | Walther et al. | |
| 2017/0320093 A1 | 11/2017 | Chatterjee et al. | |
| 2018/0255402 A1 | 9/2018 | Dehe | |
| 2019/0071305 A1* | 3/2019 | Strasser ................ | B81B 3/0018 |
| 2019/0208330 A1* | 7/2019 | Bretthauer ............. | H04R 19/04 |

* cited by examiner

MEMS SOUND TRANSDUCER ELEMENT

This application claims the benefit of European Patent Application No. 19186308, filed on Jul. 15, 2019, which application is hereby incorporated herein by reference.

TECHNICAL FIELD

Embodiments of the present disclosure relate to a MEMS (Micro Electro Mechanical System) sound transducer element being operable at a human-audible audio range and at an ultrasonic range. Some particular embodiments may relate to an audio microphone with an ultrasonic transceiver functionality. Further embodiments may relate to a sound transducer device comprising the MEMS sound transducer element.

BACKGROUND

Ultrasound is used in different technical fields, for example in gesture recognition, distance measurements (e.g. in parking assistants or proximity sensing), in presence detection, in environmental sensing (e.g. true air temperature, wind speed) and many more. For instance, distance evaluation may be executed by time-of-flight (TOF) approaches, wherein ultrasonic pulses may be transmitted by an ultrasonic speaker, and reflected ultrasonic waves may be received by an ultrasonic receiver, which may be a microphone, for example. The time interval between transmitting and receiving gives the distance to an object.

Nowadays, bulky piezoelectric actors are used for ultrasonic speakers and sometimes also for ultrasonic receivers (e.g., distance measurement in car parking assistant). However, the stiff piezo shows bad impedance matching to air, which is the reason why it is not very sensitive in receiver mode and thus has to produce very high signal intensities in speaker mode. Due to this high power requirement these transceivers are comparatively large in the range of cm² (e.g., one of the smallest currently available commercial SMD piezoelectric speaker on the market is in the range of 5.1×5.1 mm²). On top of that they work in resonant mode and are therefore very narrowband.

Conventional membrane based micromachined piezoelectric (PMUT) and capacitive (CMUT) transducers work as ultrasonic transceivers as their low mass membranes show much better impedance matching to air and therefore much lower sound pressures can be detected. The membranes used in CMUT are suspended over an evacuated or ventilated cavity. Since the membranes are quite stiff, they work well in the ultrasonic range.

Micromachined ultrasonic transceivers (MUT) for airborne ultrasound are gaining interest due to their applications in consumer electronics like proximity sensing, presence detection, gesture control. Usual MUT devices consist of a membrane placed upon an evacuated cavity using an either piezoelectric (PMUT) or capacitive (CMUT) readout. Dual Backplate based MEMS microphone technology offers a potential alternative using one of the two backplates for sending of sound signals and the other one of the two backplates for receiving of sound signals.

Problems of this approach arise on the one hand from a single ended readout, which strongly limits the reachable SNR in receiving mode. On the other hand, also the sending is limited as the sound generating membrane can only be pulled to one side. So half the stroke height is lost.

Thus, it would be desirable to provide a highly sensitive sound transducer element having small dimensions and, at the same time, covering a wideband frequency spectrum so as to be operable at a human-audible audio range and at an ultrasonic range.

SUMMARY

Therefore, according to a first aspect, a MEMS sound transducer element having the features of independent claim 1 is suggested. The MEMS sound transducer element is operable in an audio and in an ultrasonic range and comprises, inter alia, a first electrode structure, wherein a conductive material of the first electrode structure comprises a plurality of electrically isolated electrode segments. The MEMS sound transducer element further comprises a second electrode structure spaced apart from the first electrode structure, wherein the first electrode structure and the second electrode structure are operable as an audio sound transducer. A first subset of the plurality of electrically isolated electrode segments of the first electrode structure is, in conjunction with the second electrode structure, operable as an ultrasonic or audio emitter. A second subset of the plurality of the electrically isolated electrode segments of the first electrode structure is, in conjunction with the second electrode structure, operable as an ultrasonic or audio receiver.

According to a second aspect, a sound transducer device having the features of claim 14 is suggested. The sound transducer device comprises the above mentioned MEMS sound transducer element and a controller configured to operate the MEMS sound transducer element in the audio and in the ultrasonic range. Further embodiments are defined in the dependent claims.

BRIEF DESCRIPTION OF THE DRAWINGS

In the following, embodiments of the present disclosure are described in more detail with reference to the figures, in which.

DETAILED DESCRIPTION OF ILLUSTRATIVE EMBODIMENTS

Figure 1:
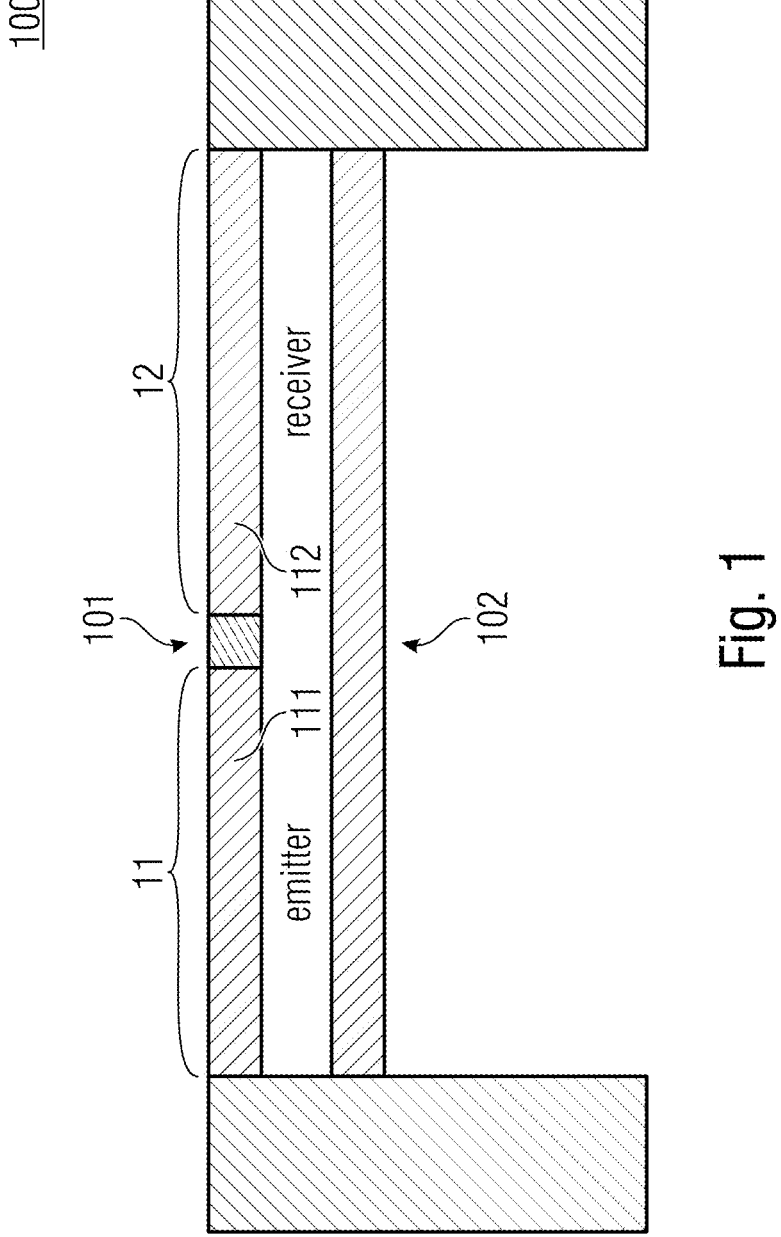
FIG. 1 shows a schematic cross-sectional view of a MEMS sound transducer element according to an embodiment.

Equal or equivalent elements or elements with equal or equivalent functionality are denoted in the following description by equal or equivalent reference numerals.

Method steps which are depicted by a block diagram and which are described with reference to said block diagram may also be executed in an order different from the depicted and/or described order. Furthermore, method steps concerning a particular feature of a device may be replaceable with said feature of said device, and the other way around.

The following non-limiting examples mention an audio range and an ultrasonic range. The audio range may cover the human-audible frequency range, for example a frequency range between 20 Hz and 20 kHz. The ultrasonic range may cover a frequency range that may not be audible by humans, wherein the human-audibility may not only depend on the frequency itself but also on the sound pressure level at a certain frequency. For example, the ultrasonic range in this disclosure may cover a frequency range between 15 kHz and 1 GHz.

In some non-limiting examples, a first electrode segment 11, 21 may be operated as a receiver and a second electrode segment 12, 22 may be operated as an emitter for sound waves in a human-audible frequency range and in an ultrasonic frequency range. However, the following description shall be understood such that the first electrode segment 11, 21 may be operated as an emitter and the second electrode segment 12, 22 may be operated as a receiver for sound waves in a human-audible frequency range and in an ultrasonic frequency range.

FIG. 1 shows an exemplary embodiment of a MEMS sound transducer element 100 being operable in a human-audible audio range and at an ultrasonic range. Accordingly, the MEMS sound transducer element 100 may comprise a dual-use functionality.

The MEMS sound transducer element 100 comprises a first electrode structure 101. The first electrode structure 101 comprises a conductive material. The first electrode structure 101 may consist of said conductive material. Additionally or alternatively, an electrically conductive layer (not shown) may be applied onto at least a portion of a surface of the first electrode structure 101.

The first electrode structure 101, and in particular the conductive material of the first electrode structure 101, may comprise a plurality of electrically isolated electrode segments 111, 112. In other words, the first electrode structure 101, and in particular the conductive material of the first electrode structure 101, may be partitioned into a plurality of electrically isolated electrode segments 111, 112. Each one of a first electrode segment 111 and a second electrode segment 112 may be connected to different signal paths, which will be explained in more detail below.

The MEMS sound transducer element boo may comprise a second electrode structure 102. The second electrode structure 102 may be spaced apart from the first electrode structure 101. For example, an air gap may exist between the first and second electrode structures 101, 102. The second electrode structure 102 may comprise a conductive material. The second electrode structure 102 may consist of said conductive material. Additionally or alternatively, an electrically conductive layer (not shown) may be applied onto at least a portion of a surface of the second electrode structure 102.

The first electrode structure 101 and the second electrode structure 102 may be operable as an audio sound transducer. An audio sound transducer may be operable as an audio sound emitter, e.g. as a speaker, and/or as an audio sound receiver, e.g. as a microphone. This may be accomplished, for instance, by a relative movement between the first electrode structure 101 and the second electrode structure 102. The audio sound transducer may be operable in the human-audible range. In this example, the first and second electrode structures 101, 102 may oscillate relative to each other at a frequency inside the human-audible frequency range.

As mentioned above, a plurality of electrically isolated electrode segments 111, 112 may be provided in the first electrode structure 101, and in particular in the conductive material of the first electrode structure 101. The first electrode structure 101 may comprise a first subset 11 of electrically isolated electrode segments and a second subset 12 of electrically isolated electrode segments. For example, the first subset 11 may comprise one or more electrode segments of a first type and the second subset 12 may comprise one or more electrode segments of a second type. The first type of electrode segments may, for instance, be coupled with a first signal path (e.g. signal transmit path) for applying an actuation/excitation signal, e.g. an actuation voltage, in order to generate an (audible and/or ultrasonic) sound signal. The second type of electrode segments may, for instance, be coupled with a second signal path (e.g. signal receive path) for receiving a measurement signal, e.g. a measurement voltage, in order to read out an (audible and/or ultrasonic) sound signal.

In the non-limiting example depicted in FIG. 1, the first subset 11 may comprise at least the first electrode segment 111, and the second subset 12 may comprise at least the second electrode segment 112. The first subset 11 may comprise more electrode segments than the exemplarily depicted first electrode segment 111, and the second subset 12 may comprise more electrode segments than the exemplarily depicted second electrode segment 112. The first subset 11, and thus the first electrode segment 111, may be coupled with a first signal path, for example with a signal transmit path for applying an actuation/excitation signal to the first electrode segment 111, and the second subset, and thus the second electrode segment 112, may be coupled with a second signal path, for example with a signal receive path for receiving a measurement signal from the second electrode segment 112.

Accordingly, the first subset 11 of the plurality of electrically isolated electrode segments of the first electrode structure 101 may be, in functional conjunction with the second electrode structure 102, operable as an ultrasonic emitter. For example, the electrode segments contained in the first subset 11 (here: the first electrode segment 111) of the first electrode structure 101 may move relative to the second electrode structure 102. Said relative movement may be caused by the actuation/excitation signal, wherein said relative movement may correspond to an oscillation at a certain frequency. In this example, the electrode segments contained in the first subset 11 (here: the first electrode segment 111) of the first electrode structure 101 may oscillate relative to the second electrode structure 102 at an ultrasonic frequency. In result, the first subset 11 may act, together with the second electrode structure 102, as an ultrasonic emitter. In other words, the first subset 11 is in functional conjunction with the second electrode structure 102 providing the functionality of an ultrasonic emitter.

The second subset 12 of the plurality of electrically isolated electrode segments of the first electrode structure 101 may be, in functional conjunction with the second electrode structure 102, operable as an ultrasonic receiver. For example, the electrode segments contained in the second subset 12 (here: the second electrode segment 112) of the first electrode structure 101 may move relative to the second electrode structure 102. Said relative movement may be caused by ultrasonic waves exciting the electrode segments contained in the second subset 12. In this example, the electrode segments contained in the second subset 12 (here: the second electrode segment 112) of the first electrode structure 101 may be excited by ultrasonic waves so as to oscillate relative to the second electrode structure 102 at an ultrasonic frequency. This excitation may be converted in a corresponding measurement signal. In result, the second subset 12 may act, together with the second electrode structure 102, as an ultrasonic receiver. In other words, the second subset 12 is in functional conjunction with the second electrode structure 102 providing the functionality of an ultrasonic receiver.

As mentioned above, the first electrode structure 101 and the second electrode structure 102 may move relatively to each other. According to an exemplary embodiment, the first electrode structure 101 may comprise or may be a membrane element of the audio sound transducer. The second electrode structure 102 may comprise or may be a counter electrode of the audio sound transducer. The membrane element 101 may be more flexible than the counter electrode 102 such that the membrane element 101 may oscillate to a greater extent than the counter electrode 102. In some examples, only the membrane element 101 may oscillate while the counter electrode 102 may serve the purpose of a rigid backplate.

In an alternative exemplary embodiment, the first electrode structure 101 may comprise or may be a counter electrode of the audio sound transducer. The second electrode structure 102 may comprise or may be a membrane element of the audio sound transducer. The membrane element 102 may be more flexible than the counter electrode 101 such that the membrane element 102 may oscillate to a greater extent than the counter electrode 101. In some examples, only the membrane element 102 may oscillate while the counter electrode 101 may serve the purpose of a rigid backplate.

In both embodiments, the membrane element may oscillate relative to the counter electrode at a human-audible frequency thereby providing the functionality of a human-audible sound emitter (e.g. speaker) and/or receiver (e.g. microphone). Additionally or alternatively, the membrane element may oscillate relative to the counter electrode at an ultrasonic frequency thereby providing the functionality of an ultrasonic emitter and/or an ultrasonic receiver. Accordingly, depending on the frequency of the oscillation, the MEMS sound transducer element 100 may serve a dual-purpose of operating as a microphone and/or as a speaker in the human-audible frequency range and as an ultrasonic emitter and/or as an ultrasonic receiver. In other words, the membrane structure and the counter electrode of the audio sound transducer may also be used as an ultrasonic transducer.

Figures 2A, 2B, 2C:
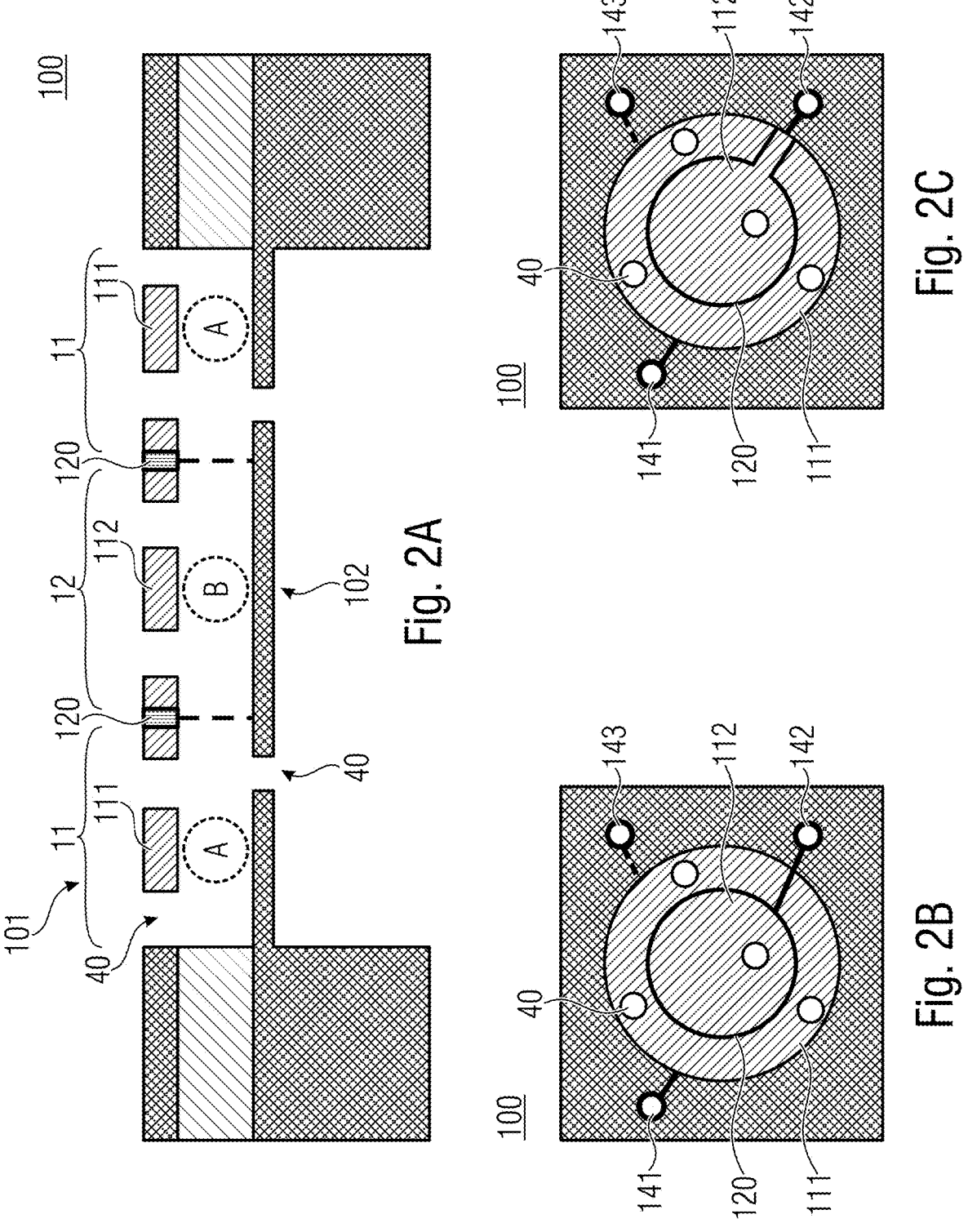
FIG. 2A shows a schematic cross-sectional view of a MEMS sound transducer element in a single backplate configuration according to an embodiment.
FIG. 2B shows a schematic top view of the MEMS sound transducer element of FIG. 2A with the dielectric separation structure in a closed configuration.
FIG. 2C shows a schematic top view of the MEMS sound transducer element of FIG. 2A with the dielectric separation structure in an open configuration.

FIGS. 2A, 2B and 2C show exemplary embodiments of a MEMS sound transducer element 100 in which the second electrode structure 102 may be a membrane element and the first electrode structure 101 may be a counter electrode for said membrane element 102. FIG. 2A shows a side cross-sectional view of the MEMS sound transducer element 100, and FIGS. 2B and 2C show a top view (not drawn to scale) of two different exemplary embodiments of the MEMS sound transducer element 100.

The counter electrode 101, also referred to as a backplate, may be segmented into a plurality of electrically isolated electrode segments 111, 112. In this non-limiting example, the counter electrode 101 may be segmented into a first subset 11 of electrode segments and a second subset 12 of electrode segments. The first subset 11 may comprise the exemplarily depicted first electrode segment 111 and the second subset 12 may comprise the exemplarily depicted second electrode segment 112.

The non-limiting examples shown in FIGS. 2A, 2B and 2C depict a configuration in which a single membrane element 102 and a single counter electrode 101 may be provided. The membrane element 102 may be distanced from the counter electrode 101. This configuration may also be referred to as a single-counter-electrode configuration or a single-backplate configuration, respectively.

The backplate 101 may be perforated and may comprise one or more openings 40, for example ventilation holes. Additionally or alternatively, the membrane element 102 may comprise one or more openings 40, for example ventilation holes. The openings 40 allow air and acoustic waves to flow through and to move between the surrounding and the cavity that is formed between the first and second electrode structures 101, 102.

As can be seen in the top views shown in FIGS. 2B and 2C, the first electrode segment 111 may have a circumferential shape. Thus, in the cross-sectional view as shown in FIG. 2A, the first electrode structure 111 is shown on the left side and on the right side of the counter electrode 101. The second electrode segment 112 may have a circular shape according to this non-limiting example. The first and second electrode segments 111, 112 may comprise other geometrical shapes, which will be described in more detail later with reference to FIGS. 3A to 3H.

Referring back to FIGS. 2A, 2B and 2C, a dielectric separation structure 120 may be provided for electrically separating and/or isolating the first and second electrode segments 111, 112 from each other. The dielectric separation structure 120 may be provided in the first electrode structure 101. For example, the dielectric separation structure 120 may be provided in the conductive material of the first electrode structure 101. Additionally or alternatively, the dielectric separation structure 120 may be provided in the second electrode structure 102. For example, the dielectric separation structure 120 may be provided in the conductive material of the second electrode structure 102. The dielectric separation structure 120 may serve the purpose of providing the plurality of electrically isolated electrode segments 111, 112 of the first electrode structure 101. The dielectric separation structure 120 may define the electrode segments 111, 112 and/or the subsets 11, 12 of electrode segments.

The dielectric separation structure 120 may, for instance, comprise a narrow gap formed in the first electrode structure 101, and in particular in the conductive material of the first electrode structure 101. Said gap may be filled with a dielectric material. The gap may comprise a lateral extension (width) in the range of some hundreds of nanometers to some tens or even hundreds of micrometers.

FIG. 2B shows an example in which the dielectric separation structure 120 comprises a closed shape. That is, the dielectric separation structure 120 is closed in itself and does not comprise any open ends.

FIG. 2C shows an alternative example in which the dielectric separation structure 120 comprises an open shape. That is, the dielectric separation structure 120 comprises one or more open ends. This may be beneficial since it may allow an easy contacting of the inner area, for example by a contacting portion 142.

In both of the non-limiting examples as shown in FIGS. 2B and 2C, the dielectric separation structure 120 may comprise a round or circular shape. However, as mentioned above, the geometrical shape of the dielectric structure 120 is not limited to the circumferential round or circular shape as depicted in FIG. 2B or 2C.

FIGS. 3A to 3H show some further non-limiting and possible examples of geometrical shapes of the dielectric structure 120.

Figure 3C:
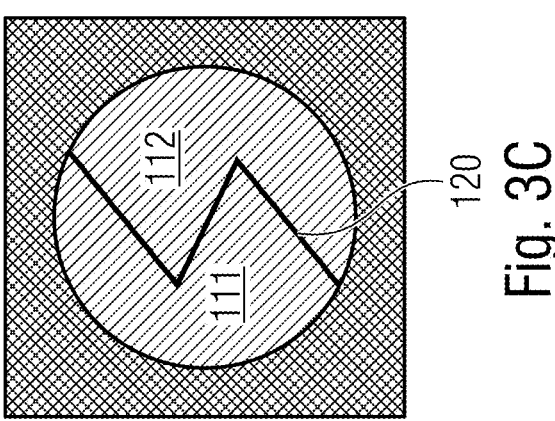
FIGS. 3A-3H show some examples of geometrical shapes and configurations of a dielectric separation structure for partitioning an electrode structure into two or more electrode segments.
Figure 3B:
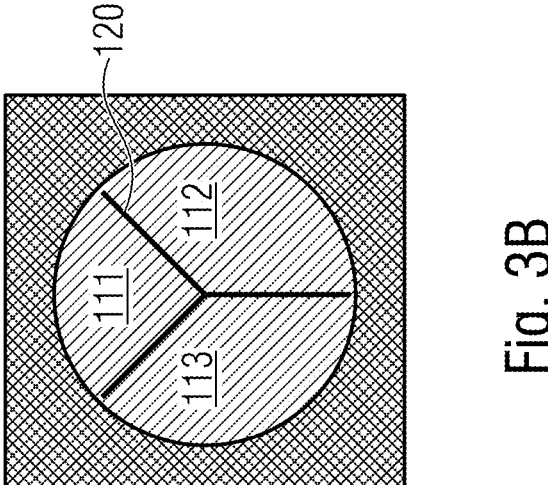
Figure 3A:
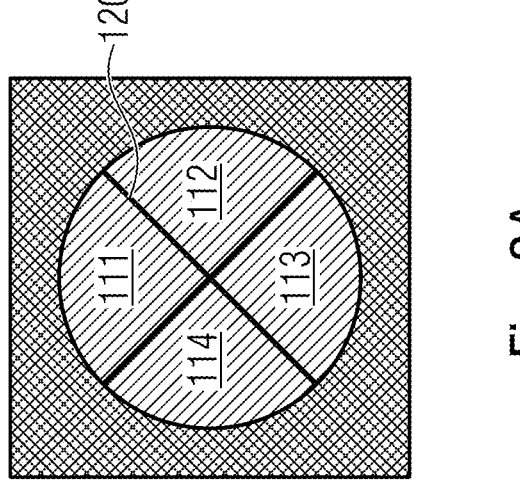

FIG. 3A shows an example in which the dielectric structure 120 comprises an open line shape formed like the letter 'X'. The dielectric structure 120 may partition the first electrode structure 101 into two or more electrode segments, for example into a first electrode segment 111, a second electrode segment 112, a third electrode segment 113 and a fourth electrode segment 114. One or more of the electrode segments 111 to 114 may be members of a subset. For example, one or more of the electrode segments, e.g. the first and third electrode segments 111, 113, may be members of a first subset 11 of electrode segments, and other one or more of the electrode segments, e.g. the second and fourth electrode segments 112, 114, may be members of a second subset 12 of electrode segments. For example the one or more electrode segments, e.g. the first and third electrode segments 111, 113, contained in the first subset 11 may be used for operating the MEMS sound transducer element 100 as an (audible and/or ultrasonic) emitter, while the other one or more electrode segments, e.g. the second and fourth electrode segments 112, 114, contained in the second subset 12 may be used for operating the MEMS sound transducer element boo as an (audible and/or ultrasonic) receiver, or vice versa.

FIG. 3B shows a further example in which the dielectric structure 120 comprises an open line shape formed like the letter 'Y'. The dielectric structure 120 may partition the first electrode structure 101 into two or more electrode segments, for example into a first electrode segment 111, a second electrode segment 112 and a third electrode segment 113. One or more of the electrode segments 111 to 113 may be members of a subset. For example, one or more of the electrode segments, e.g. the first electrode segment 111, may be a member of a first subset 11 of electrode segments, and other one or more of the electrode segments, e.g. the second and third electrode segments 112, 113, may be members of a second subset 12 of electrode segments. For example the one or more electrode segments, e.g. the first electrode segment 111, contained in the first subset 11 may be used for operating the MEMS sound transducer element 100 as an (audible and/or ultrasonic) emitter, while the other one or more electrode segments, e.g. the second and third electrode segments 112, 113, contained in the second subset 12 may be used for operating the MEMS sound transducer element 100 as an (audible and/or ultrasonic) receiver, or vice versa.

FIG. 3C shows a further example in which the dielectric structure 120 comprises an open polygon shape formed in a zig-zag like manner. The dielectric structure 120 may partition the first electrode structure 101 into a first electrode segment 111 and a second electrode segment 112. The first electrode segment 111 may be a member of a first subset 11 of electrode segments, and the second electrode segment 112 may be a member of a second subset 12 of electrode segments. For example the first electrode segment 111 contained in the first subset 11 may be used for operating the MEMS sound transducer element 100 as an (audible and/or ultrasonic) emitter, while the second electrode segment 112 contained in the second subset 12 may be used for operating the MEMS sound transducer element 100 as an (audible and/or ultrasonic) receiver, or vice versa.

Figure 3F:
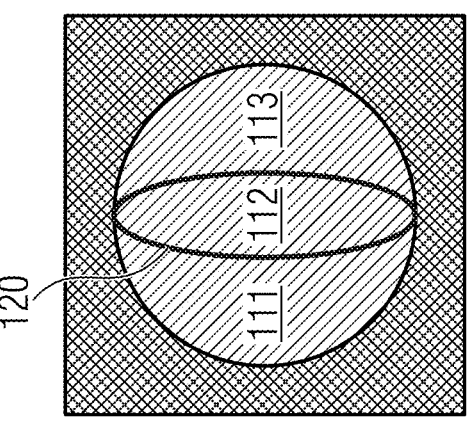
Figure 3E:
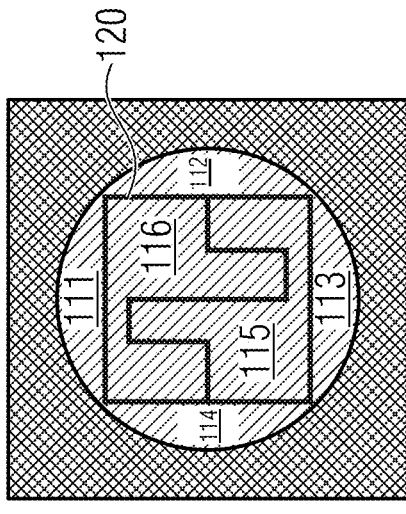
Figure 3D:
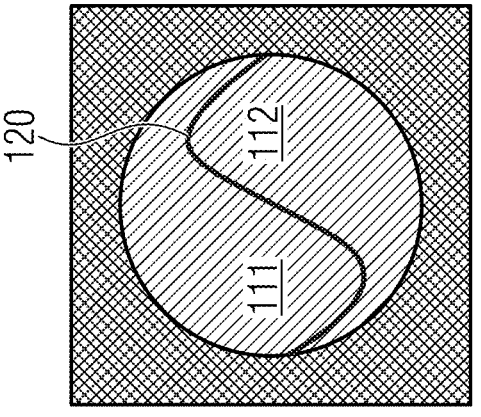

FIG. 3D shows a further example in which the dielectric structure 120 comprises an open sinusoidal shape. The dielectric structure 120 may partition the first electrode structure 101 into a first electrode segment 111 and a second electrode segment 112. The first electrode segment 111 may be a member of a first subset 11 of electrode segments, and the second electrode segment 112 may be a member of a second subset 12 of electrode segments. For example the first electrode segment 111 contained in the first subset 11 may be used for operating the MEMS sound transducer element 100 as an (audible and/or ultrasonic) emitter, while the second electrode segment 112 contained in the second subset 12 may be used for operating the MEMS sound transducer element 100 as an (audible and/or ultrasonic) receiver, or vice versa.

FIG. 3E shows an example in which the dielectric structure 120 comprises a closed rectangular (e.g. square) shape in combination with an open line shape, e.g. a meandering shape inside the closed rectangle. The portion of the dielectric structure 120 comprising the rectangular shape may partition the first electrode structure 101 into one or more, e.g. into four electrode segments 111, 112, 113, 114, outside the rectangle and one or more electrode segments inside the rectangle. The one or more electrode segments inside the rectangle may be further partitioned, in this example by the meander-shaped portion of the dielectric structure 120, into two or more electrode segments. In the non-limiting example depicted in FIG. 3E, the inner electrode segment may be further partitioned into two or more electrode segments, e.g. into a fifth electrode segment 115 and a sixth electrode segment 116. One or more of the first to sixth electrode segments 111 to 116 may be members of a first and second subset, respectively, as described above.

FIG. 3F shows a further example in which the dielectric structure 120 comprises a closed elliptical shape. The dielectric structure 120 may partition the first electrode structure 101 into two or more electrode segments, e.g. into a first electrode segment 111, a second electrode segment 112 and a third electrode segment 113. One or more of the electrode segments 111 to 113 may be members of a subset. For example, the one or more electrode segments, e.g. the first and third electrode segments 111, 113, outside the ellipse may be members of a first subset 11 of electrode segments, and the other one or more electrode segments, e.g. the second electrode segment 112, inside the ellipse may be a member of a second subset 12 of electrode segments. For example the one or more electrode segments, e.g. the first and third electrode segments 111, 113, contained in the first subset 11 may be used for operating the MEMS sound transducer element 100 as an (audible and/or ultrasonic) emitter, while the other one or more electrode segments, e.g. the second electrode segment 112, contained in the second subset 12 may be used for operating the MEMS sound transducer element 100 as an (audible and/or ultrasonic) receiver, or vice versa.

Figure 3H:
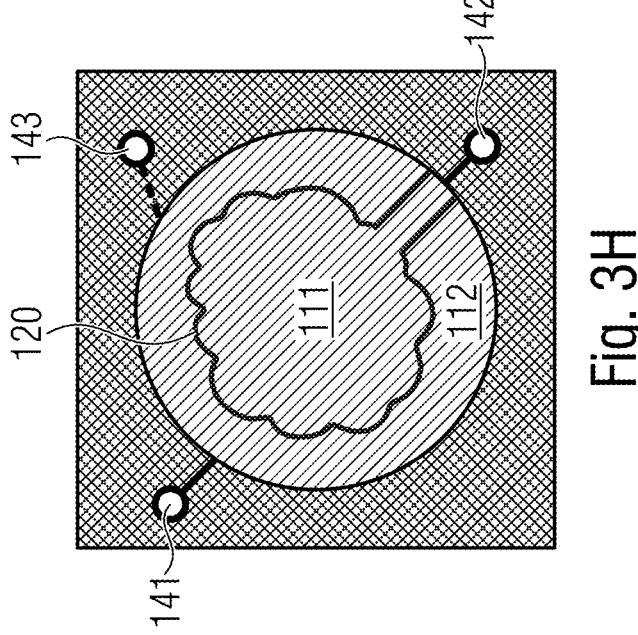
Figure 3G:
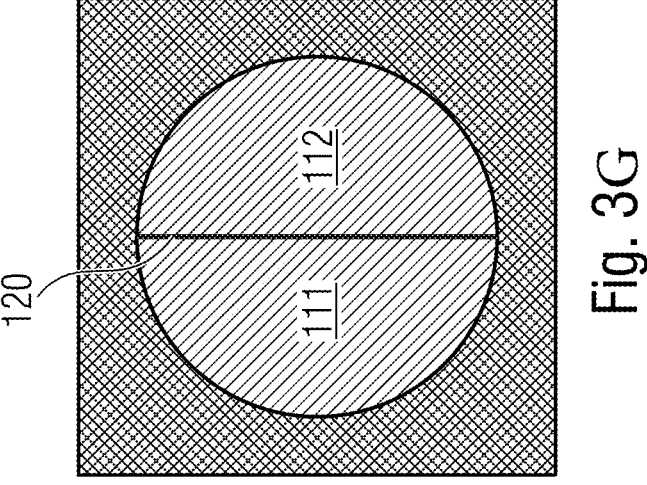

FIG. 3G shows a further example in which the dielectric structure 120 comprises an open line shape comparable to the letter "I". The dielectric structure 120 may partition the first electrode structure 101 into a first electrode segment 111 and a second electrode segment 112. The first electrode segment 111 may be a member of a first subset 11 of electrode segments, and the second electrode segment 112 may be a member of a second subset 12 of electrode segments. For example the first electrode segment 111 contained in the first subset 11 may be used for operating the MEMS sound transducer element 100 as an (audible and/or ultrasonic) emitter, while the second electrode segment 112 contained in the second subset 12 may be used for operating the MEMS sound transducer element 100 as an (audible and/or ultrasonic) receiver, or vice versa.

FIG. 3H shows a further example in which the dielectric structure 120 comprises an open meander shape formed in a random manner. The dielectric structure 120 may partition the first electrode structure 101 into a first electrode segment 111 and a second electrode segment 112. The first electrode segment 111 may be a member of a first subset 11 of electrode segments, and the second electrode segment 112 may be a member of a second subset 12 of electrode segments. For example, the dielectric structure 120 may partition the first electrode structure 101 into an inner electrode segment, e.g. the first electrode segment 111, and into an outer electrode segment, e.g. the second electrode segment 112. The open shape of the dielectric structure 120 may be beneficial for easy contacting of the inner electrode segment 111. As can be seen, a contact portion 142 may be provided for electrically contacting the inner electrode segment 111 since the dielectric separation structure 120 electrically separates and/or isolates the inner electrode segment 111 from the outer electrode segment 112. The outer electrode segment 112 may be electrically contacted by a separate contact portion 141. In this example, the first electrode segment 111 contained in the first subset 11 may be used for operating the MEMS sound transducer element 100 as an (audible and/or ultrasonic) emitter, while the second electrode segment 112 contained in the second subset 12 may be used for operating the MEMS sound transducer element 100 as an (audible and/or ultrasonic) receiver, or vice versa.

Stated in more general terms, the dielectric separation structure 120 may comprise at least one of an open polygon shape or a closed polygon shape, an open or closed circumferential shape, an open or closed ring shape, an open or closed square shape, and an open or closed ellipse shape, a line shape, a meander shape, and a sinusoidal shape in the first electrode structure for providing the plurality of electrically isolated electrode segments. An open shape is to be understood as a geometrical shape that has at least one open end, while a closed shape is to be understood as a geometrical shape that has at least one closed connection.

As mentioned above, the first and second subsets 11, 12 of electrode segments may have different properties, e.g. different electrical properties. For example, the first subset 11 may be connected to a signal transmit path and the second subset 12 may be connected to a signal receive path. The signal transmit path may be configured to provide an actuation/excitation signal to the first or second subset 11, 12, while the signal receive path may be configured to receive a measurement signal from the first or second subset 11, 12. Depending on this particular electrical property of the first and second subsets 11, 12, respectively, the first and second subsets 11, 12 may be operable, in conjunction with the second electrode structure 102, as an (audible or ultrasonic) sound emitter or as an (audible or ultrasonic) sound receiver, respectively.

Referring back to FIG. 2A, the first subset 11 may be operable in mode 'A', while the second subset 12 may be operable in mode 'B'. For example, mode 'A' may be an emitter-mode, wherein the first subset 11 may be operable as an (audible or ultrasonic) emitter, while mode 'B' may be a receiver-mode, wherein the second subset 12 may be operable as an (audible or ultrasonic) receiver. In an alternative example, mode 'A' may be a receiver mode, wherein the first subset 11 may be operable as an (audible or ultrasonic) receiver, and mode 'B' may be an emitter-mode, wherein the second subset 12 may be operable as an (audible or ultrasonic) emitter. The operation mode may depend on the signal connection, i.e. whether the respective subset 11, 12 receives a measurement signal in a receiving signal path (or read-out path) or whether the respective subset 11, 12 transmits an actuation/excitation signal in a transmission signal path (or excitation signal path).

Referring back to FIGS. 2B and 2C, the first subset 11 of the first electrode structure 101 may be connected with a first electrical signal connector 141, the second subset 12 of the first electrode structure 101 may be connected with a second electrical signal connector 142, and the second electrode structure 102 may be connected with a third electrical signal connector 143. As exemplarily described above, the second electrode structure 102 may be a membrane element being configured to oscillate at a predetermined frequency, e.g. at a frequency inside a human-audible frequency spectrum and/or at a frequency inside the ultrasonic frequency spectrum. The first electrode structure 101 may be a counter electrode for said membrane element 102.

For example, the membrane element 102 may be connected to a first electrical potential via its associated third signal connector 143. The first subset 11 of the counter electrode 101 may be connected to a second electrical potential (different from the first electrical potential) by its associated first signal connector 141. The second subset 12 of the counter electrode 101 may be connected to the second or a third electrical potential (different from the first electrical potential) by its associated second signal connector 142.

The first connector 141 may define a transmit signal path for providing an actuation/excitation signal to the first subset 11 (emitter/speaker) of the first electrode structure 101. Since the first electrode structure 101 acts as a counter electrode for the membrane element 102, the membrane element 102 deflects and oscillates in response to the actuation signal. The membrane element 102 may oscillate in either the human-audible frequency spectrum or in the ultrasonic spectrum depending on the actuation/excitation signal, e.g. a sine burst. In this case, the first subset 11 of the first electrode structure 101 may be operated as an (audible or ultrasonic) emitter.

The second connector 142 may define a receive signal path for receiving an oscillation signal from the second subset 12 (receiver/microphone). Since the first electrode structure 101 acts as a counter electrode for the membrane element 102, oscillations of the membrane element 102 are converted into an electrical measurement signal. The membrane element 102 may oscillate in either the human-audible frequency spectrum or in the ultrasonic spectrum depending on the acoustic waves which deflect the membrane element 102. In this case, the second subset 12 of the first electrode structure 101 may be operated as an (audible or ultrasonic) receiver.

Figure 4A:
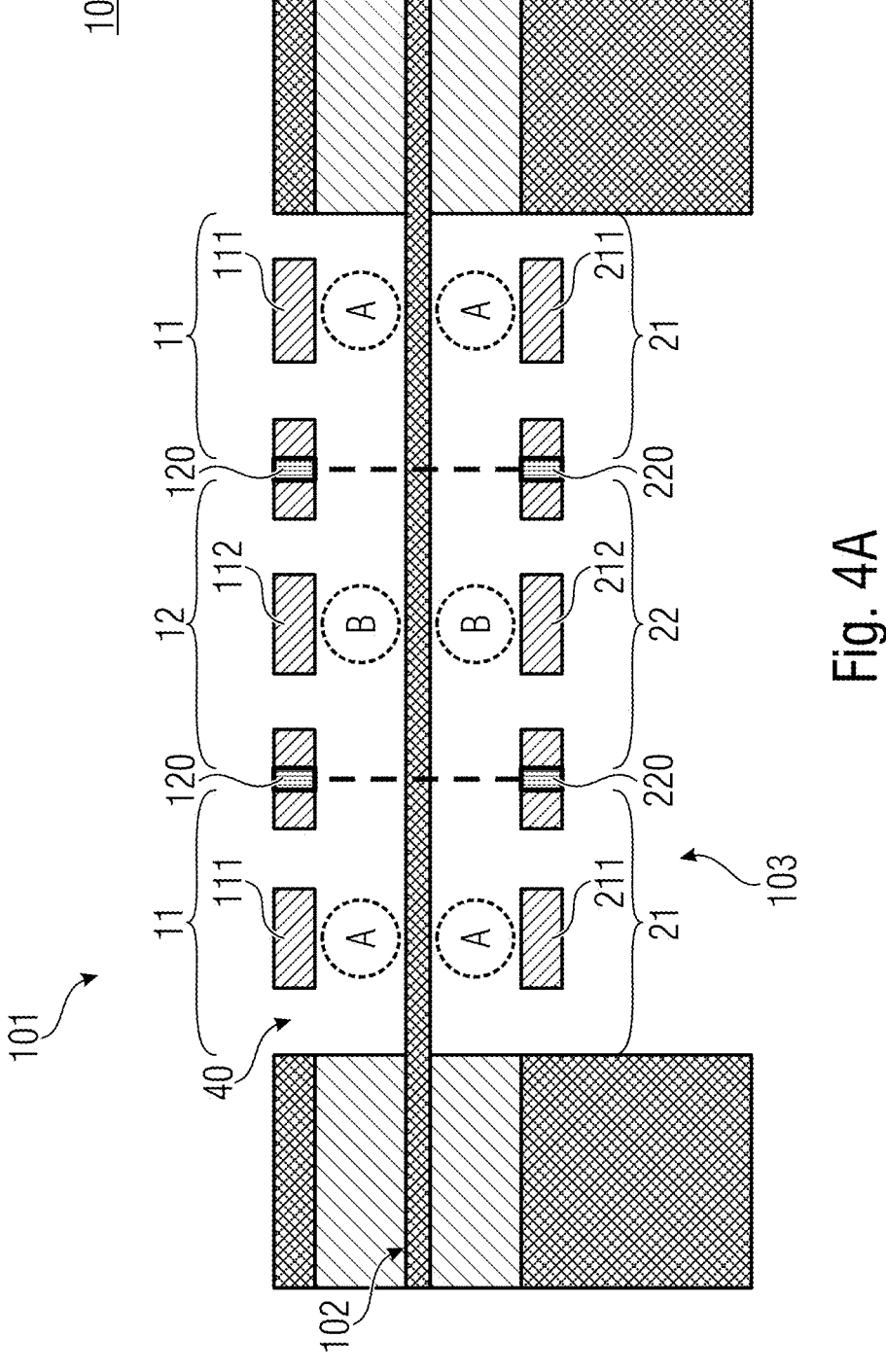
FIG. 4A shows a schematic cross-sectional view of a MEMS sound transducer element in a double backplate configuration according to an embodiment.
Figure 4C:
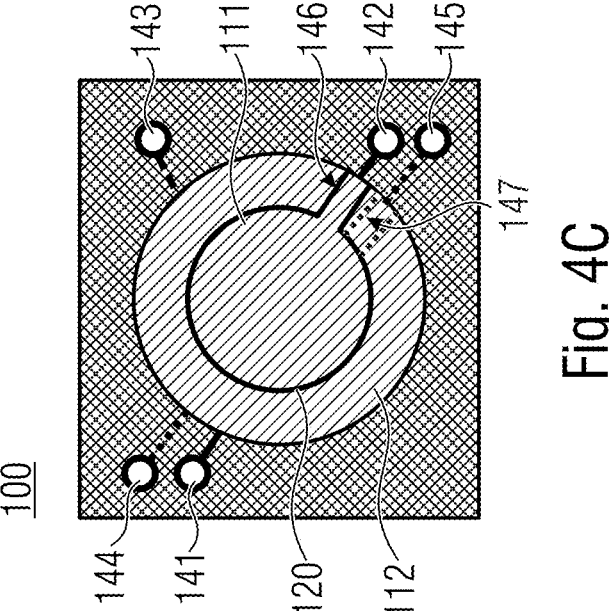
FIG. 4C shows a schematic top view of the MEMS sound transducer element of FIG. 3A with the dielectric separation structure in an open configuration.
Figure 4B:
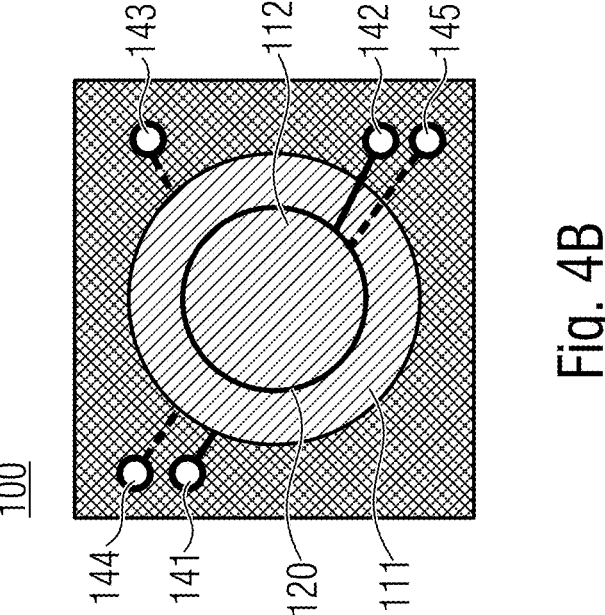
FIG. 4B shows a schematic top view of the MEMS sound transducer element of FIG. 3A with the dielectric separation structure in a closed configuration.

FIGS. 4A, 4B (closed configuration) and 4C (open configuration) show some further exemplary embodiments. These embodiments may be similar to the embodiments shown in FIGS. 2A, 2B (closed configuration) and 2C (open configuration). Thus only the differences may be discussed, wherein the embodiments of FIGS. 4A, 4B and 4C may differ from the embodiments shown in FIGS. 2A, 2B and 2C by a third electrode structure 103. The third electrode structure 103 may comprise a conductive material. The third electrode structure 103 may consist of said conductive material. Additionally or alternatively, an electrically conductive layer (not shown) may be applied onto at least a portion of a surface of the third electrode structure 103. The third electrode structure 103 may be similar or identical to the first electrode structure 101.

The first, second and third electrode structures 101, 102, 103 may be arranged such that the second electrode structure 102 may be arranged between the first and third electrode structures 101, 103.

The third electrode structure 103 may comprise a further dielectric separation structure 220. The further dielectric separation structure 220 may be provided in the conductive material of the third electrode structure 103. The further dielectric separation structure 220 may partition the third electrode structure 103 into a plurality of electrically isolated electrode segments 211, 212.

The further dielectric separation structure 220 of the third electrode structure 103 may be similar or identical to the dielectric separation structure 120 of the first electrode structure 101. For example, the further dielectric separation structure 220 of the third electrode structure 103 may be formed by providing a narrow gap in (the conductive material of) the third electrode structure 103 and filling this gap with a dielectric material.

Furthermore, the further dielectric separation structure 220 of the third electrode structure 103 may comprise at least one of the geometrical shapes which have been previously discussed in FIGS. 3A to 3H with reference to the first electrode structure 101.

The third electrode structure 103 may comprise a first subset 21 of electrode segments and a second subset 22 of electrode segments. Each of the first and second subsets 21, 22 may comprise one or more electrically isolated electrode segments 211, 212. For example, the first subset 21 may comprise the first electrode segment 211 of the third electrode structure 103, and the second subset 22 may comprise the second electrode segment 212 of the third electrode structure 103.

In the non-limiting example shown in FIGS. 4A, 4B (closed configuration) and 4C (open configuration), the first electrode structure 101 and the third electrode structure 103 may be arranged in a mirrored configuration. For instance, the dielectric separation structure 120 of the first electrode structure 101 and the dielectric separation structure 220 of the third electrode structure 103 may be arranged in a mirrored configuration. Accordingly, both dielectric structures 120, 220 may comprise the same, but mirrored, geometrical shape. In this case, also the first and second subsets 11, 12 of the first electrode structure 101 and the first and second subsets 21, 22 of the third electrode structure 103 may be arranged in a mirrored configuration.

As can be seen in FIG. 4B, the mirrored dielectric structures 120, 220 may be congruent. As can be seen in FIG. 4C, the mirrored dielectric structures 120, 220 may be displaced, e.g. slightly rotated, relative to each other. As exemplarily depicted in FIG. 4C, the open portion 146 of the dielectric structure 120 of the first electrode structure 101 may be (rotationally and/or translationally) displaced relative to the open portion 147 of the dielectric structure 220 of the third electrode structure 103.

In the non-limiting example of FIGS. 4A, 4B (closed configuration) and 4C (open configuration), the second electrode structure 102 may be a membrane element. The first electrode structure 101 may provide a first counter electrode for the membrane element 102. The third electrode structure 103 may provide a second counter electrode for the membrane element 102.

The first subset 11 of the first electrode structure 101 and the first subset 21 of the third electrode structure 103 may both be operable in mode 'A', while the second subset 12 of the first electrode structure 101 and the second subset 22 of the third electrode structure 103 may both be operable in mode 'B'. For example, the first subsets 11, 21 may be operable as (audible or ultrasonic) emitters, and the second subsets 12, 22 may be operable as (audible or ultrasonic) receivers. In an alternative example, the first subsets 11, 21 may be operable as (audible or ultrasonic) receivers, and the second subsets 12, 22 may be operable as (audible or ultrasonic) emitters. The operation mode may depend on the signal connection of the respective subsets 11, 12, 21, 22.

Referring to FIGS. 4B (closed configuration) and 4C (open configuration), the first subset 11 of the first electrode structure 101 may have a first electrical signal connector 141, and the second subset 12 of the first electrode structure 101 may have a second electrical signal connector 142. The second electrode structure 102 may have a third electrical signal connector 143. The first subset 21 of the third electrode structure 102 may have a first electrical signal connector 144, and the second subset 22 of the third electrode structure 103 may have a second electrical signal connector 145. The signal connectors 141-145 may be used as transmit signal path connectors for providing an electric excitation signal to the respective electrode structures 101, 102, 103, or as receive signal path connectors for reading out the receiving signals (e.g., voltage signals) from the respective electrode structures 101, 102, 103.

As exemplarily described above, the second electrode structure 102 may be a membrane element being configured to oscillate at a predetermined frequency, e.g. at a frequency inside a human-audible frequency spectrum or at a frequency inside the ultrasonic frequency spectrum. The first electrode structure 101 may be a first counter electrode for said membrane element 102, and the third electrode structure 103 may be a second counter electrode for said membrane element 102.

For example, the membrane element 102 may be connected to a first electrical potential via its associated third signal connector 143. The first subset 11 of the first counter electrode 101 and the first subset 21 of the second counter electrode 103 may be connected to a second electrical potential (different from the first electrical potential) by their associated first signal connectors 141, 144. The second subset 12 of the first counter electrode 101 and the second subset 22 of the second counter electrode 103 may be connected to the second or a third electrical potential (different from the first electrical potential) by their associated second signal connectors 142, 145.

According to this non-limiting example, the first connectors 141, 144 may define a transmit signal path for providing an actuation/excitation signal to the first subsets 11, 21 (emitter/speaker) of the first and third electrode structures 101, 103. Since the first and third electrode structures 101, 103 may act as a counter electrode for the membrane element 102, the membrane element 102 deflects and oscillates in response to the actuation signal. The membrane element 102 may oscillate in either the human-audible frequency spectrum or in the ultrasonic spectrum depending on the actuation signal, e.g. a sine burst. In this case, the first subsets 11, 21 of the first and third electrode structures 101, 103 are operated as an (audible or ultrasonic) emitter.

The second connectors 142, 145 may define a receive signal path for receiving an oscillation signal from the second subsets 12, 22 (receiver/microphone) of the first and third electrode structures 101, 103. Since the first and third electrode structures 101, 103 may act as a counter electrode for the membrane element 102, oscillations of the membrane element 102 are converted into an electrical measurement signal. The membrane element 102 may oscillate in either the human-audible frequency spectrum or in the ultrasonic spectrum depending on the acoustic waves which deflect the membrane element 102. In this case, the second subsets 12, 22 of the first and third electrode structures 101, 2013 are operated as an (audible or ultrasonic) receiver.

Again, each of the first and second subsets 11, 12, 21, 22 of the first and third electrode structures 101, 103 may comprise one or more electrically isolated electrode segments 111, 112, 211, 212.

The non-limiting examples shown in FIGS. 4A, 4B (closed configuration) and 4C (open configuration) depict a configuration in which a membrane element 102 is arranged between a first and a second counter electrode 101, 103. The membrane element 102 may be distanced from the first and the second counter electrodes 101, 103. This configuration may also be referred to as a double-counter-electrode configuration or a double-backplate configuration, respectively.

In an alternative example (not shown), the first electrode structure 101 may be a membrane element, the third electrode structure 103 may be a membrane element, and the second electrode structure 102 may provide a counter electrode for both membrane elements 101, 103. The counter electrode 102 may be arranged between both membrane elements 101, 103. The counter electrode 102 may be distanced from the first and the second membrane elements 101, 103. This configuration may also be referred to as a double-membrane configuration.

In either case, the first and second subsets 11, 12, 21, 22 of the first and third electrode structures 101, 103 may be operable as an audio sound transducer and as an ultrasonic transducer. The audio sound transducer may comprise an audio sound emitter (e.g. speaker) and/or an audio sound receiver (e.g. microphone). Accordingly, at least one of the first and second subsets 11, 12, 21, 22 may be operable as a sound emitter (e.g. speaker) while the other one of the first and second subsets 11, 12, 21, 22 may be operable as a sound receiver (e.g. microphone). The ultrasonic transducer may comprise an ultrasonic emitter and/or an ultrasonic receiver. Accordingly, at least one of the first and second subsets 11, 12, 21, 22 may be operable as an ultrasonic emitter while the other one of the first and second subsets 11, 12, 21, 22 may be operable as an ultrasonic receiver.

Accordingly, the MEMS sound transducer boo may be a dual-purpose device being operable in an audio and an ultrasonic range.

Furthermore, the first and second subsets 11, 12, 21, 22 may allow for emitting and receiving ultrasonic waves at the same time. The first and second subsets 11, 12, 21, 22 may also allow for emitting and receiving human-audible sound waves at the same time.

The double-backplate configuration as shown in FIGS. 4A, 4B (closed configuration) and 4C (open configuration) may allow for a differential read out. For example, in the (audible and/or ultrasonic) receiving mode, a deflection of the membrane element 102 towards the first electrode structure 101 may be measured. A corresponding first measurement signal may be taken at the receive path connector 142 being connected with a respective one of the plurality of electrode segments 111, 112 of the first electrode structure 101. Additionally, a deflection of the membrane element 102 away from the third electrode structure 103 may be measured. A corresponding second measurement signal may be taken at the receive path connector 145 being connected with a respective one of the plurality of electrode segments 211, 212 of the third electrode structure 101. The first and second measurement signal may be (e.g., differentially) combined with each other which leads to a more precise measurement result. Thus, the SNR (Signal to Noise Ratio) of the MEMS sound transducer 100 may be increased when being operated in the (audible and/or ultrasonic) receiver mode.

Furthermore, when being operated in the (audible and/or ultrasonic) emitter mode, a dual push-pull actuation may be applied. For example, a first actuation signal may be put on the first electrode structure 101, and a second actuation signal may be put on the third electrode structure 103. The first and second actuation signals may differ from each other in their polarity and/or electrical potential, for example. Due to these two different actuation signals, the membrane element 102 may be pulled towards one of the first and third electrode structures 101, 103 and may be pushed away from the other one of the first and third electrode structures 101, 103.

Figure 5:
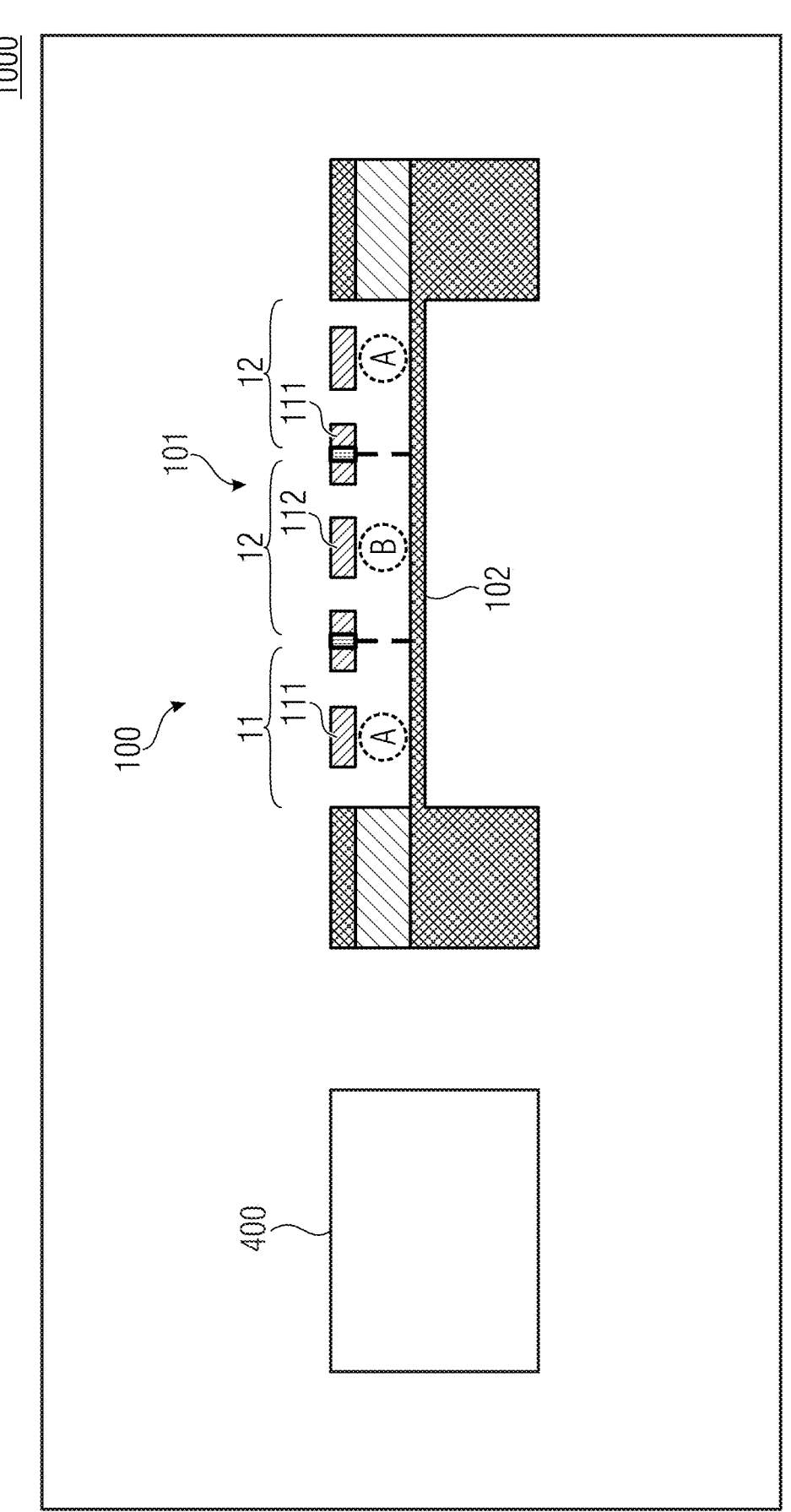
FIG. 5 shows a schematic block diagram of a sound transducer device comprising a MEMS sound transducer element in a single backplate configuration.
Figure 6:
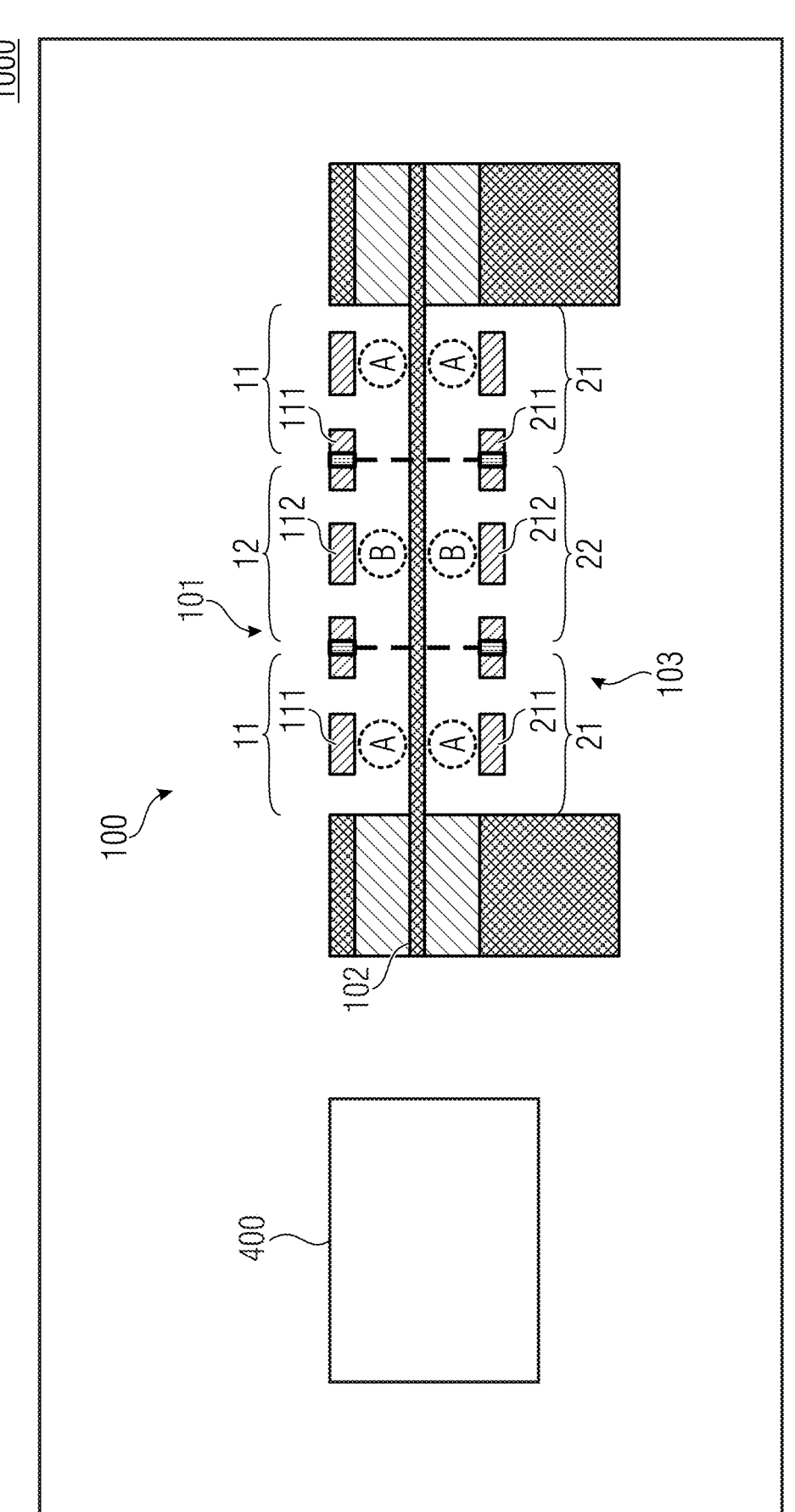
FIG. 6 shows a schematic block diagram of a sound transducer device comprising a MEMS sound transducer element in a double backplate configuration.

Summarizing, the exemplary embodiments of FIGS. 2A, 2B (closed configuration) and 2C (open configuration) show a single backplate configuration, and the exemplary embodiments of FIGS. 4A, 4B (closed configuration) and 4C (open configuration) show a double backplate configuration. Both configurations of the MEMS sound transducer element 100 may be applied in a sound transducer device 1000, as shown in FIGS. 5 and 6. FIG. 5 shows a non-limiting example of a sound transducer device woo comprising a MEMS sound transducer element 100 in a single backplate configuration similar or identical to the one discussed above. The sound transducer device 1000 may further comprise a controller 400. The controller 400 may comprise an integrated circuit, for example an Application Specific Integrated Circuit (ASIC). The controller 400 may be configured to operate the MEMS sound transducer element 100 in the audio range and in the ultrasonic range.

Though not explicitly shown, the controller 400 may be electrically connected with the MEMS sound transducer element 100, for example by bond wires.

As described above, the MEMS sound transducer element 100 in the single backplate configuration may provide an audio output signal, for example at a respective one of the connectors 141, 142 (FIGS. 2B, 2C). Accordingly, the MEMS sound transducer element 100 may be operated as a sound receiver (e.g., microphone) in the human-audible frequency spectrum. Additionally or alternatively, an excitation signal may be provided to the MEMS sound transducer element 100 in the single backplate configuration, for example via a respective one of the connectors 141, 142 (FIGS. 2B, 2C). Accordingly, the MEMS sound transducer element 100 may be operated as a sound emitter (e.g., speaker) in the human-audible frequency spectrum.

Accordingly, the controller 400 may be configured to detect and/or emit, in the audio range, an audio signal of the MEMS sound transducer element 100, which audio signal may be generated by a relative movement (oscillation) between the first and second electrode structures 101, 102.

The dual-purpose function of the herein described principle allows the MEMS sound transducer element 100 to additionally be operated as an ultrasonic emitter and/or an ultrasonic receiver. Therefore, at least one of the first and second subsets 11, 12 of the first electrode structure 101 may be excited by an actuation signal in the ultrasonic frequency spectrum to generate an ultrasonic sound signal, thereby providing the functionality of an ultrasonic emitter. Additionally or alternatively, at least the other one of the first and second subsets 11, 12 of the first electrode structure 101 may detect an ultrasonic sound signal, thereby providing the functionality of an ultrasonic receiver. The ultrasonic sound signal may be detected/emitted by a relative movement (oscillation) between at least one of the first and second subsets 11, 12 of the first electrode structure 101 and the second electrode structure 102.

For example, the controller 400 may be configured to excite, in the ultrasonic range, the first subset 11 of the electrically isolated electrode segments 111, 112 of the first electrode structure 101, in functional conjunction with the second electrode structure 102, in order to operate as the ultrasonic emitter.

Additionally or alternatively, the controller 400 may be configured to read out the second subset 12 of the electrically isolated electrode segments 111, 112 of the first electrode structure 101, in functional conjunction with the second electrode structure 102, in order to operate as the ultrasonic receiver.

FIG. 6 shows a non-limiting example of a sound transducer device 1000 comprising a MEMS sound transducer element 100 in a double backplate configuration similar or identical to the one discussed above. The sound transducer device 1000 may further comprise a controller 400. The controller 400 may comprise an integrated circuit, for example an Application Specific Integrated Circuit (ASIC). The controller 400 may be configured to operate the MEMS sound transducer element 100 in the audio range and in the ultrasonic range.

Though not explicitly shown, the controller 400 may be electrically connected with the MEMS sound transducer element 100, for example by bond wires.

As described above, the double-backplate configuration may allow for a differential read out. For example, in the (audible and/or ultrasonic) receiving mode, a deflection of the membrane element 102 towards the first electrode structure 101 may provide a first measurement signal, and a deflection of the membrane element 102 away from the third electrode structure 103 may provide a second measurement signal. The first and second measurement signals may be (e.g. differentially) combined with each other which leads to a more precise measurement result. Thus, the SNR (Signal to Noise Ratio) of the MEMS sound transducer element 100 may be increased when being operated in the (audible and/or ultrasonic) receiver mode.

Accordingly, the controller 400 may be configured to differentially read out at least one of the first and second subsets 11, 12 of the electrically isolated electrode segments 111, 112 of the first electrode structure 101 and at least one of the first and second subsets 21, 22 of the electrically isolated electrode segments 211, 212 of the third electrode structure 103, in order to operate, in conjunction with the second electrode structure 102, as the ultrasonic receiver. For example, the second subsets 12, 22 of the first and third electrode structures 103 may be differentially read out.

Summarizing, the herein described principle may provide for a dual-use MEMS sound transducer element 100 being operable in both the human-audible sound frequency range and in the ultrasonic frequency range. The electrode structures 101, 102, 103 of the MEMS sound transducer element 100 may be separated into one or more electrically isolated electrode segments 111, 112, 211, 212. A dielectric structure 120, 220 provided in the respective electrode structure 101,

102, 103 may provide the electric isolation between the electrode segments 111, 112, 211, 212. One or more electrode segments may be contained in a subset 11, 12, 21, 22 of electrode segments. The number of electrode segments contained in a subset 11, 12, 21, 22 may depend on the geometrical shape and configuration of the dielectric structure 120, 220. A dielectric separation structure (e.g., a ring) may be used in a backplate, for example.

The electrode structures 101, 102, 103 may be a membrane element or a counter electrode (backplate). A membrane element may be more flexible than a counter electrode. The membrane element may be excited by an excitation signal so that the membrane element may oscillate relative to the counter electrode(s). The membrane element may oscillate relative to the electrode segments 111, 112, 211, 212 and/or relative to the subsets 11, 12, 21, 22 of electrode segments. Depending on the frequency of the oscillation of the membrane element, the MEMS sound transducer element 100 may be operated as a sound emitter in both the human-audible sound frequency range and the ultrasonic frequency range. The membrane element may oscillate in reaction to received audio waves. The membrane element may receive audio waves in both the human-audible sound frequency range and in the ultrasonic frequency range. Accordingly, the MEMS sound transducer element 100 may be operated as a sound receiver in both the human-audible sound frequency range and the ultrasonic frequency range. In other words, one part (e.g., one subset) of the segmented electrode structure 101, 102, 103 may be used for receiving signals and another part (e.g., another subset) of the segmented electrode structure 101, 102, 103 may be used for sending/emitting signals.

The herein described principle has technical advantages over conventional systems, for example:

High SNR differential readout can be achieved without changing current ASIC concept and therefore making no sacrifices in receive mode SNR High SNR allows package size reduction Both bottom and top backplate may be used for actuation, i.e. one backplate pulls the membrane while the other backplate pushes the membrane->Push-Pull actuation principle can be achieved since an actuation signal can be put on electrodes on both sides of the membrane allowing for full control over membrane (push-pull) to use maximum stroke height Low cost single backplate implementation is enabled, i.e. implementation of the transceiver concept in lower cost single Backplate technology possible Sending and receiving circuitry can stay separated (re-use of existing ASIC)

Send- and Receive-Pins can be electrically separated, i.e. the receiving path (ASIC) may remain unchanged making it easy to maintain high SNR properties Sound pressure output increases object detection distance Higher SNR microphone enables Smartphone implementation and package size reduction Similar SNR and AOP (Acoustic Overload Point) expected as standard differential microphones Could replace classical MEMS microphones, offering more sensing opportunities, e.g., Proximity sensing "real air temperature" measurements outside the device Wind speed measurement The MEMS sound transducer element 100 and the sound transducer device 1000 as described herein may be embodied according to the following examples:

According to an aspect, a MEMS sound transducer element (100) being operable in an audio and an ultrasonic range may be provided, MEMS sound transducer element (100) comprising a first electrode structure (101), wherein a conductive material of the first electrode structure (101) comprises a plurality of electrically isolated electrode segments (111, 112), a second electrode structure (102) spaced apart from the first electrode structure (101), wherein the first electrode structure (101) and the second electrode structure (102) are operable as an audio sound transducer, wherein a first subset (11) of the plurality of electrically isolated electrode segments (111, 112) of the first electrode structure (101) is, in conjunction with the second electrode structure (102), operable as an ultrasonic or audio emitter, and wherein a second subset (12) of the plurality of the electrically isolated electrode segments (111, 112) of the first electrode structure (101) is, in conjunction with the second electrode structure (102), operable as an ultrasonic or audio receiver.

According to an aspect, the first electrode structure (101) is a membrane element and the second electrode structure (102) is a counter electrode of the audio sound transducer, or the first electrode structure (101) is a counter electrode and the second electrode structure (102) is a membrane element of the audio sound transducer.

According to an aspect, the first electrode structure (101) comprises a dielectric separation structure (120) provided in the conductive material of the first electrode structure (101) for providing the plurality of electrically isolated electrode segments (111, 112) of the first electrode structure (101).

According to an aspect, the dielectric separation structure (120) comprises a gap in the conductive material of the first electrode structure (101), which gap is filled with a dielectric material.

According to an aspect, the dielectric separation structure (120) comprises an open polygon shape or a closed polygon shape in the first electrode structure (101) for providing the plurality of electrically isolated electrode segments (111, 112).

According to an aspect, the dielectric separation structure (120) comprises at least one of an open or closed circumferential shape, an open or closed ring shape, an open or closed square shape, and an open or closed ellipse shape in the first electrode structure (101) for providing the plurality of electrically isolated electrode segments (111, 112).

According to an aspect, the dielectric separation structure (120) comprises at least one of a line shape, a meander shape, and a sinusoidal shape in the first electrode structure (101) for providing the plurality of electrically isolated electrode segments (111, 112).

According to an aspect, the MEMS sound transducer element (10o) further comprises a third electrode structure (103) comprising a conductive material, wherein the third electrode structure (103) comprises a further dielectric separation structure (220) provided in the conductive material of the third electrode structure (103) for providing a plurality of electrically isolated electrode segments (211, 212) in the third electrode structure (103).

According to an aspect, the further dielectric separation structure (220) comprises at least one of an open or closed polygon shape, an open or closed circumferential shape, an open or closed ring shape, an open or closed square shape, an open or closed ellipse shape, a line shape, a meander shape, and a sinusoidal shape for providing the plurality of electrically isolated electrode segments (211, 212) in the third electrode structure (103).

According to an aspect, a first subset (11) of the plurality of electrically isolated electrode segments (111, 112) of the first electrode structure (101) and a first subset (21) of the plurality of electrically isolated electrode segments (211, 212) of the third electrode structure (103) are, in conjunction with the second electrode structure (102), operable as the ultrasonic emitter, and wherein a second subset (12) of the plurality of electrically isolated electrode segments (111, 112) of the first electrode structure (101) and a second subset (21) of the plurality of electrically isolated electrode segments (211, 2121) of the third electrode structure (103) are, in conjunction with the second electrode structure (102), operable as the ultrasonic receiver.

According to an aspect, the dielectric separation structure (120) of the first electrode structure (101) and the dielectric separation structure (220) of the third electrode structure (103) are arranged in a mirrored configuration.

According to an aspect, the first, second and third electrode structures (101, 102, 103) are arranged in a double counter electrode configuration, wherein the first electrode structure (101) is a first counter electrode, the second electrode structure (102) is a membrane element, and the third electrode structure (103) is a second counter electrode of the audio sound transducer, and wherein the membrane element (102) is arranged between the first and second counter electrodes (101, 103).

According to an aspect, the first, second and third electrode structures (101, 102, 103) are arranged in a double membrane configuration, wherein the first electrode structure (101) is a first membrane element, the second electrode structure (102) is a counter electrode, and the third electrode structure (103) is a second membrane element of the audio sound transducer, wherein the counter electrode (102) is arranged between the first and second membrane elements (101, 103).

According to an aspect, a sound transducer device (1000) is provided, comprising the MEMS sound transducer element (100) according to any one of the proceeding aspects, and a controller (400) configured to operate the MEMS sound transducer element (100) in the audio and ultrasonic range.

According to an aspect, the controller (400) is configured to detect, in the audio range, an audio output signal of the MEMS sound transducer element (100) between the first and second electrode structures (101, 102), and wherein the controller (400) is configured to excite, in the ultrasonic range, the first subset (11) of the electrically isolated electrode segments (111, 112) of the first electrode structure (101), in conjunction with the second electrode structure (102), to operate as the ultrasonic emitter, and to read out the second subset (12) of the electrically isolated electrode segments (111, 112) of the first electrode structure (101), in conjunction with the second electrode structure (102), to operate as the ultrasonic receiver.

According to an aspect, the MEMS sound transducer element (100) comprises a third electrode structure (103) comprising a conductive material, wherein the third electrode structure (103) comprises a further dielectric separation structure (220) in the conductive material of the third electrode structure (103) for providing a plurality of electrically isolated electrode segments (211, 212) of the third electrode structure (103), and wherein the controller (400) is configured to differentially read out the second subset (12) of the electrically isolated electrode segments (111, 112) of the first electrode structure (101) and the second subset (22) of the electrically isolated electrode segments (211, 212) of the third electrode structure (103), in order to operate, in conjunction with the second electrode structure (102), as the ultrasonic receiver.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative embodiments, this description is not intended to be construed in a limiting sense. Various modifications and combinations of the illustrative embodiments, as well as other embodiments of this disclosure, will be apparent to persons skilled in the art upon reference to the description. It is therefore intended that the appended claims encompass any such modifications or embodiments.

What is claimed is:

1. A MEMS sound transducer element operable in an audio and an ultrasonic range, comprising:
   a first electrode structure, wherein a conductive material of the first electrode structure comprises a plurality of electrically isolated electrode segments;
   a second electrode structure spaced apart from the first electrode structure by a cavity;
   wherein the first electrode structure and the second electrode structure are operable as an audio sound transducer;
   wherein a first subset of the plurality of electrically isolated electrode segments of the first electrode structure is, in conjunction with the second electrode structure, operable as an ultrasonic or audio emitter;
   wherein a second subset of the plurality of the electrically isolated electrode segments of the first electrode structure is, in conjunction with the second electrode structure, operable as an ultrasonic or audio receiver; and
   wherein the first electrode structure is a counter electrode and wherein the second electrode structure is a single membrane element parallel to each of the plurality of electrically isolated electrode segments of the first electrode structure.

2. The MEMS sound transducer element according to claim 1,
   wherein the first electrode structure comprises a dielectric separation structure provided in the conductive material of the first electrode structure for providing the plurality of electrically isolated electrode segments of the first electrode structure.

3. The MEMS sound transducer element according to claim 2,
   wherein the dielectric separation structure comprises a gap in the conductive material of the first electrode structure, which gap is filled with a dielectric material.

4. The MEMS sound transducer element according to claim 2,
   wherein the dielectric separation structure comprises an open polygon shape or a closed polygon shape in the first electrode structure for providing the plurality of electrically isolated electrode segments.

5. The MEMS sound transducer element according to claim 2,
   wherein the dielectric separation structure comprises at least one of an open or closed circumferential shape, an open or closed ring shape, an open or closed square shape, and an open or closed ellipse shape in the first electrode structure for providing the plurality of electrically isolated electrode segments.

6. The MEMS sound transducer element according to claim 2,
   wherein the dielectric separation structure comprises at least one of a line shape, a meander shape, and a sinusoidal shape in the first electrode structure for providing the plurality of electrically isolated electrode segments.

7. The MEMS sound transducer element according to claim 2, further comprising:
   a third electrode structure comprising a conductive material,
   wherein the third electrode structure comprises a further dielectric separation structure provided in the conductive material of the third electrode structure for providing a plurality of electrically isolated electrode segments in the third electrode structure.

8. The MEMS sound transducer element according to claim 7,
   wherein the further dielectric separation structure comprises at least one of an open or closed polygon shape, an open or closed circumferential shape, an open or closed ring shape, an open or closed square shape, an open or closed ellipse shape, a line shape, a meander shape, and a sinusoidal shape for providing the plurality of electrically isolated electrode segments in the third electrode structure.

9. The MEMS sound transducer element according to claim 7,
   wherein the first subset of the plurality of electrically isolated electrode segments of the first electrode structure and a first subset of the plurality of electrically isolated electrode segments of the third electrode structure are, in conjunction with the second electrode structure, operable as the ultrasonic or audio emitter, and
   wherein the second subset of the plurality of electrically isolated electrode segments of the first electrode structure and a second subset of the plurality of electrically isolated electrode segments of the third electrode structure are, in conjunction with the second electrode structure, operable as the ultrasonic or audio receiver.

10. The MEMS sound transducer element according to claim 7,
    wherein the dielectric separation structure of the first electrode structure and the dielectric separation structure of the third electrode structure are arranged in a mirrored configuration.

11. The MEMS sound transducer element according to claim 7,
    wherein the first, second and third electrode structures are arranged in a double counter electrode configuration,
    wherein the first electrode structure is a first counter electrode, the second electrode structure is a membrane element, and the third electrode structure is a second counter electrode of the audio sound transducer, and
    wherein the membrane element is arranged between the first and second counter electrodes.

12. A sound transducer device, comprising:
    the MEMS sound transducer element according to claim 1, and
    a controller configured to operate the MEMS sound transducer element in the audio and the ultrasonic ranges.

13. The sound transducer device according to claim 12,
wherein the controller is configured to detect, in the audio
range, an audio output signal of the MEMS sound
transducer element between the first and second elec-
trode structures, and
wherein the controller is configured to
excite, in the ultrasonic range, the first subset of the
electrically isolated electrode segments of the first
electrode structure, in conjunction with the second
electrode structure, to operate as the ultrasonic emitter,
and
to read out the second subset of the electrically isolated
electrode segments of the first electrode structure, in
conjunction with the second electrode structure, to
operate as the ultrasonic receiver.

14. The sound transducer device according to claim 12,
wherein the MEMS sound transducer element comprises
a third electrode structure comprising a conductive
material,
wherein the third electrode structure comprises a further
dielectric separation structure in the conductive mate-
rial of the third electrode structure for providing a
plurality of electrically isolated electrode segments of
the third electrode structure, and
wherein the controller is configured to
differentially read out the second subset of the electrically
isolated electrode segments of the first electrode struc-
ture and a second subset of the electrically isolated
electrode segments of the third electrode structure, in
order to operate, in conjunction with the second elec-
trode structure, as the ultrasonic receiver.

* * * * *